(12) United States Patent
Noro

(10) Patent No.: US 6,707,337 B2
(45) Date of Patent: Mar. 16, 2004

(54) SELF-OPERATING PWM AMPLIFIER

(75) Inventor: Masao Noro, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/253,077

(22) Filed: Sep. 24, 2002

(65) Prior Publication Data

US 2003/0058039 A1 Mar. 27, 2003

(30) Foreign Application Priority Data

Sep. 27, 2001 (JP) ........................................ 2001-298268

(51) Int. Cl.[7] ................................................. H03F 3/38
(52) U.S. Cl. ........................ 330/10; 330/207 A; 330/251
(58) Field of Search ............................. 330/10, 207 A, 330/251

(56) References Cited

U.S. PATENT DOCUMENTS 4,649,565 A * 3/1987 Kaizer et al. ............... 330/251
6,166,596 A * 12/2000 Higashiyama et al. ........ 330/10
6,614,297 B2 * 9/2003 Score et al. .................. 330/10

* cited by examiner

Primary Examiner—Nguyen Khanh Van
(74) Attorney, Agent, or Firm—Pillsbury Winthrop LLP

(57) ABSTRACT

Differential integrator circuit integrates a differential between a difference between a signal supplied from a first signal source and a feedback signal of amplifier output and a difference between a signal supplied from a second signal source and a feedback signal of the amplifier output. The signal supplied from the second signal source is opposite in phase from the signal supplied from the first signal source. Thus, the integrator circuit outputs two integrated signals of different polarities. Comparator compares the two integrated signals from the integrator circuit to thereby output a PWM signal. First driver circuit amplifies the PWM signal and outputs the amplified PWM signal with inverted phase, and a second driver circuit amplifies the PWM signal and outputs the amplified PWM signal with noninverted phase. First switching circuit is driven by the output of the first driver circuit, while a second switching circuit is driven by the output of the second driver circuit.

6 Claims, 14 Drawing Sheets

US 6,707,337 B2

SELF-OPERATING PWM AMPLIFIER

BACKGROUND OF THE INVENTION

The present invention relates generally to self-running or self-operating PWM (Pulse Width Modulation) amplifiers, and more particularly to a novel self-operating PWM amplifier that can be suitably used to amplify audio signals.

Among examples of the so-called class-D amplifiers are self-running or self-operating PWM amplifiers. FIG. 11 shows a general setup of a conventional self-operating PWM amplifier. In the figure, the self-operating PWM amplifier includes an integrator circuit that is composed of an operational amplifier 301 and a capacitor 302 connected between an inverted (negative) input terminal and an output terminal of the operational amplifier 301, a comparator that is composed of resistors R1, R2 and an operational amplifier 303, a driver 304, and a CMOS inverter 305 functioning as a switching circuit.

In the CMOS inverter 305, as illustratively shown in FIG. 16, the drains of a PMOS transistor 600 and NMOS transistor 601 are interconnected, and the connection point between these drains is connected to an output terminal 603. The gates of the PMOS transistor 600 and NMOS transistor 601 are interconnected, and the connection point between these gates is connected to an input terminal 602. Further, the source of the PMOS transistor 600 is connected to a supply voltage +Vcc, while the source of the NMOS transistor 601 is connected to another supply voltage −Vcc.

The output terminal of the CMOS inverter 305 is coupled, via a low-pass filter composed of an inductance L1 and capacitor C1, to one input terminal of a speaker 306 that is a load of the PWM amplifier, and the other input terminal of the speaker 306 is grounded. In addition, the output terminal of the CMOS inverter 305 is coupled via the resistor R2 to a noninverted (positive) input terminal of the operational amplifier 303 and also coupled via a feedback resistor $R_{NF}$ to a noninverted input terminal of the operational amplifier 301 constituting the integrator circuit.

Output terminal of the operational amplifier 301 of the integrator circuit is coupled via the resistor R1 to the noninverted input terminal of the operational amplifier 303 of the comparator. Further, a signal source 300 is connected via an input resistor $R_{IN}$ to the inverted input terminal of the operational amplifier 301. Noninverted input terminal of the operational amplifier 301 and inverted input terminal of the operational amplifier 303 are each grounded.

The self-operating PWM amplifier of FIG. 11 arranged in the above-described manner, as a whole, functions as an inverting amplifier having a gain corresponding to a resistance ratio of $R_{NF}/R_{IN}$. Namely, in this self-operating PWM amplifier, a difference between an analog signal (audio signal) $V_{IN}$ input from the signal source 300 via the input resistor $R_{IN}$ and an output signal (switching signal) negatively fed back from the CMOS inverter 305 via the feedback resistor $R_{NF}$ is integrated via the integrator circuit composed of the operational amplifier 301 and capacitor 302, and the resultant integrated output from the integrator circuit is converted into a binary PWM (Pulse Width Modulated) signal by means of the hysteresis comparator composed of the resistors R1, R2 and operational amplifier 303.

Further, in the self-operating PWM amplifier, the PWM signal is amplified by the driver circuit 304, and, on the basis of the PWM signal, the driver circuit 304 drives the CMOS inverter 305 for switching operations. Output from the CMOS inverter 305 is not only supplied to the speaker 306 via the low-pass filter composed of the inductance L1 and capacitor C1 but also negatively fed, via the feedback resistor $R_{NF}$, back to the inverted input terminal of the operational amplifier 301 constituting the integrator circuit. In this manner, the PWM amplifier can operate by itself.

When no analog signal $V_{IN}$ is input from the signal source 300 to the operational amplifier 301 of the integrator circuit, an output voltage V3 from the CMOS inverter 305, functioning as a switching circuit, switches between the level of the supply voltage +Vcc (i.e., "high level") and the level of the supply voltage −Vcc (i.e., "low level") with a 50% duty cycle, as denoted by a dot-and-dash line in FIG. 12.

Because the noninverted input terminal of the integrator-circuit-constituting operational amplifier 301 is fixed to 0 V, when the output voltage V3 from the CMOS inverter 305 is at the high level, an output voltage V1 from the operational amplifier 301 of the integrator circuit, integrating the output voltage V3 from the CMOS inverter 305, increases in a negative direction (falls) with the passage of time. When the output voltage V3 from the CMOS inverter 305 has switched to the low level, the output voltage V1 from the operational amplifier 301 increases in a positive direction (rises). Consequently, the output voltage V3 from the CMOS inverter 305 presents a triangular voltage waveform as denoted by a broken line in FIG. 12.

As the output voltage V1 from the integrator circuit increases in the negative direction (falls), an input voltage V2 to the noninverted input terminal of the operational amplifier 303, constituting the hysteresis comparator, also increases in the negative direction. Because the output voltage V3 from the CMOS inverter 305, switching to the low level as the input voltage V2 to the operational amplifier 303 drops to 0 V, is positively fed back to the noninverted input terminal of the operational amplifier 303 via the resistor R2. Thus, the input voltage V2 to the noninverted input terminal of the operational amplifier 303 is rapidly drawn in the negative direction to a level that is determined by the current output voltage V1 from the integrator circuit, output voltage V3 from the CMOS inverter 305 and resistance ratio between the resistors R1 and R2.

Then, as the output voltage V1 from the integrator circuit increases in the positive direction, the input voltage V2 to the operational amplifier 303 increases. Because the output voltage V3 from the CMOS inverter 305, switching to the high level as the input voltage V2 to the operational amplifier 303 rises to 0 V, is positively fed back to the noninverted input terminal of the operational amplifier 303 via the resistor R2. Thus, the input voltage V2 to the noninverted input terminal of the operational amplifier 303 rapidly rises to a level that is determined by the current output voltage V1 from the integrator circuit, output voltage V3 from the CMOS inverter 305 and resistance ratio between the resistors R1 and R2. In this way, the input voltage V2 to the noninverted input terminal of the operational amplifier 303 varies as denoted by a solid line in FIG. 12.

When, on the other hand, an analog signal $V_{IN}$ is input from the signal source 300 to the operational amplifier 301 constituting the integrator circuit, the capacitor 302 repeats electrical recharging and discharging operations at a rate or with an inclination corresponding to the level of the input signal thereto, so that the output voltage V1 from the operational amplifier 301 presents a waveform as denoted by a broken line in FIG. 13. During that time, the CMOS inverter 305 outputs a binary signal, similar to a PWM signal, having pulse widths corresponding to the level of the input analog signal V$_{IN}$ (denoted by a solid line in FIG. 13) and varying between the high and low levels.

The PWM amplifier generally modulates an input signal with a high-frequency carrier signal, and thus in a case where such amplifiers of two stereophonic channels or more are mounted together on a single semiconductor chip, the amplifiers tend to cause greater mutual interferences therebetween than where liner amplifiers are mounted on the chip. Such great interferences between the amplifiers would often invite crosstalk and beats between the carrier frequencies, thus resulting in various inconveniences, such as a poor S/N ratio.

Although the PWM amplifier can have, at the input side of the integrator circuit, a feedback loop for negatively feeding back the amplifier output to reduce a distortion factor, it can not provide feedback over wide frequency bands, as permitted by the liner amplifier, due to the presence of the carrier frequency, so that the PWM amplifier tends to cause a great distortion factor.

SUMMARY OF THE INVENTION

In view of the foregoing, it is an object of the present invention to provide a novel self-operating PWM amplifier which, in a case where a plurality of such PWM amplifiers are mounted together, can minimize interferences between the amplifiers and achieves an improved distortion factor characteristic.

In order to accomplish the above-mentioned object, the present invention provides a novel self-operating PWM amplifier, which includes a differential integrator circuit having a first input terminal to which are input a first analog signal supplied from a first signal source and a negative feedback signal of amplified output of the PWM amplifier, and a second input terminal to which are input a second analog signal supplied from a second signal source and a negative feedback signal of the amplified output of the PWM amplifier. The second analog signal has a same amplitude as, but is opposite in phase from, the first analog signal, and the differential integrator circuit outputs two integrated signals of different polarities, by integrating a difference between the first analog signal and the negative feedback signal input to the first input terminal and a difference between the second analog signal and the negative feedback signal input to the second input terminal. The self-operating PWM amplifier also includes a comparator having two differential input terminals to which positive feedback is provided to present hysteresis characteristics. The comparator compares the two integrated signals output by the differential integrator circuit and thereby outputs a PWM signal. The self-operating PWM amplifier further includes: a first switching circuit having a pair of switching elements connected between first and second power supplies, a connection point between the switching elements being connected to one input terminal of a load; a second switching circuit having a pair of switching elements connected between the first and second power supplies, a connection point between the switching elements being connected to another input terminal of the load; a first driver circuit that delivers the PWM signal from the comparator to the first switching circuit; and a second driver circuit that delivers the PWM signal from the comparator to the second switching circuit.

In the self-operating PWM amplifier of the invention, the entire circuitry is constructed as balanced circuitry to receive balanced input signals and produce balanced output signals. This balanced circuitry arrangement can reduce influences of external noise and can minimize interferences in a case where a plurality of such amplifiers are mounted together. Further, the balanced operations of the self-operating PWM amplifier, permitted by the balanced circuitry, can effectively cancel out distortion of even-number order harmonics, and thus achieves an improved distortion factor characteristic. Furthermore, with the arrangement that positive feedback is provided to the two differential input terminals of the comparator, the input voltage to the comparator at predetermined comparison timing can be 0 V so that the comparator can operate at low voltage.

The self-operating PWM amplifier of the invention may further includes: a first feedback circuit connected between the first input terminal of the differential integrator circuit and an output terminal of the first switching circuit; and a second feedback circuit connected between the second input terminal of the differential integrator circuit and an output terminal of the second switching circuit. Here, the negative feedback signal of the amplified output is delivered via the first feedback circuit to the first input terminal of the differential integrator circuit, and also the negative feedback signal of the amplified output is delivered via the second feedback circuit to the second input terminal of the differential integrator circuit.

In one embodiment, the output terminal of the first switching circuit is connected to the one input terminal of the load via a first low-pass filter for eliminating a carrier-frequency component, and the output terminal of the second switching circuit is connected to the other input terminal of the load via a second low-pass filter for eliminating a carrier frequency component.

Preferably, the differential integrator circuit includes: an in-phase feedback type operational amplifier having a pair of differential input terminals, consisting of inverted and non-inverted input terminals, to which are input the first analog signal and feedback signal and the second analog signal and feedback signal, respectively, and a pair of differential output terminals, consisting of two inverted output terminals, which output two integrated signals of different polarities; and integrating capacitors connected between the inverted input terminal and one of the inverted output terminals of the operational amplifier and between the noninverted input terminal and the other of the inverted output terminals of the operational amplifier, respectively. Because the in-phase feedback type operational amplifier having a pair of differential input terminals and a pair of differential output terminals is employed as an operational amplifier of the differential integrator circuit, the differential integrator circuit can operate in a completely balanced manner, which can even further reduce the influences of external noise. Namely, if constructed otherwise, the integrator circuit would be very susceptible to the influences of external noise due to the facts that the integrating capacitors have high impedance, the integrator circuit is a beginning-stage circuit of the self-operating PWM amplifier and the integrating capacitors repeat recharging/discharging operations at a high frequency. However, because, as described above, the integrator circuit of the invention is implemented by the in-phase feedback type operational amplifier that has differential input terminals and differential output terminals and can operates in a completely balanced manner, the present invention can effectively reduce the influences of external noise and operate at low voltage.

In one embodiment, the comparator having hysteresis characteristics comprises an in-phase feedback type operational amplifier having a pair of differential input terminals to which are input the two integrated signals of different polarities output by the differential integrator circuit and a pair of differential output terminals for outputting PWM signals of positive and negative phases by comparing the two integrated signals. Because the integrator circuit of the invention is implemented by the in-phase feedback type operational amplifier having differential input terminals and differential output terminals, it can operate in a completely balanced manner, and the invention can even further reduce the influences of external noise.

Preferably, each of the first and second feedback circuits includes a first feedback loop for passing a high-frequency component of an amplified output signal to be supplied to the load, and a second feedback loop for passing a low-frequency component of the amplified output signal to be supplied to the load. With this arrangement, the present invention achieve an improved S/N ratio and distortion factor characteristic over wide (low-to high) frequency bands of input signals.

The following will describe embodiments of the present invention, but it should be appreciated that the present invention is not limited to the described embodiments and various modifications of the invention are possible without departing from the basic principles of the invention. The scope of the present invention is therefore to be determined solely by the appended claims.

BRIEF DESCRIPTION OF THE DRAWINGS

For better understanding of the object and other features of the present invention, its preferred embodiments will be described hereinbelow in greater detail with reference to the accompanying drawings, in which.

DETAILED DESCRIPTION OF THE INVENTION

Before going into a detailed description of preferred embodiments of the present invention, a brief description will be made about an example of an improvement over the conventional self-running or self-operating PWM amplifier, with reference to FIG. 14. The improved self-operating PWM amplifier of FIG. 14 has an output stage constructed to output an amplified signal on the basis of the so-called BTL (Balanced Transformer Less) scheme, and such a BTL-type output signal is negatively fed, via a differential amplifier section, back to an input side of an integrator circuit constituting an input stage of the PWM amplifier.

Figure 14:
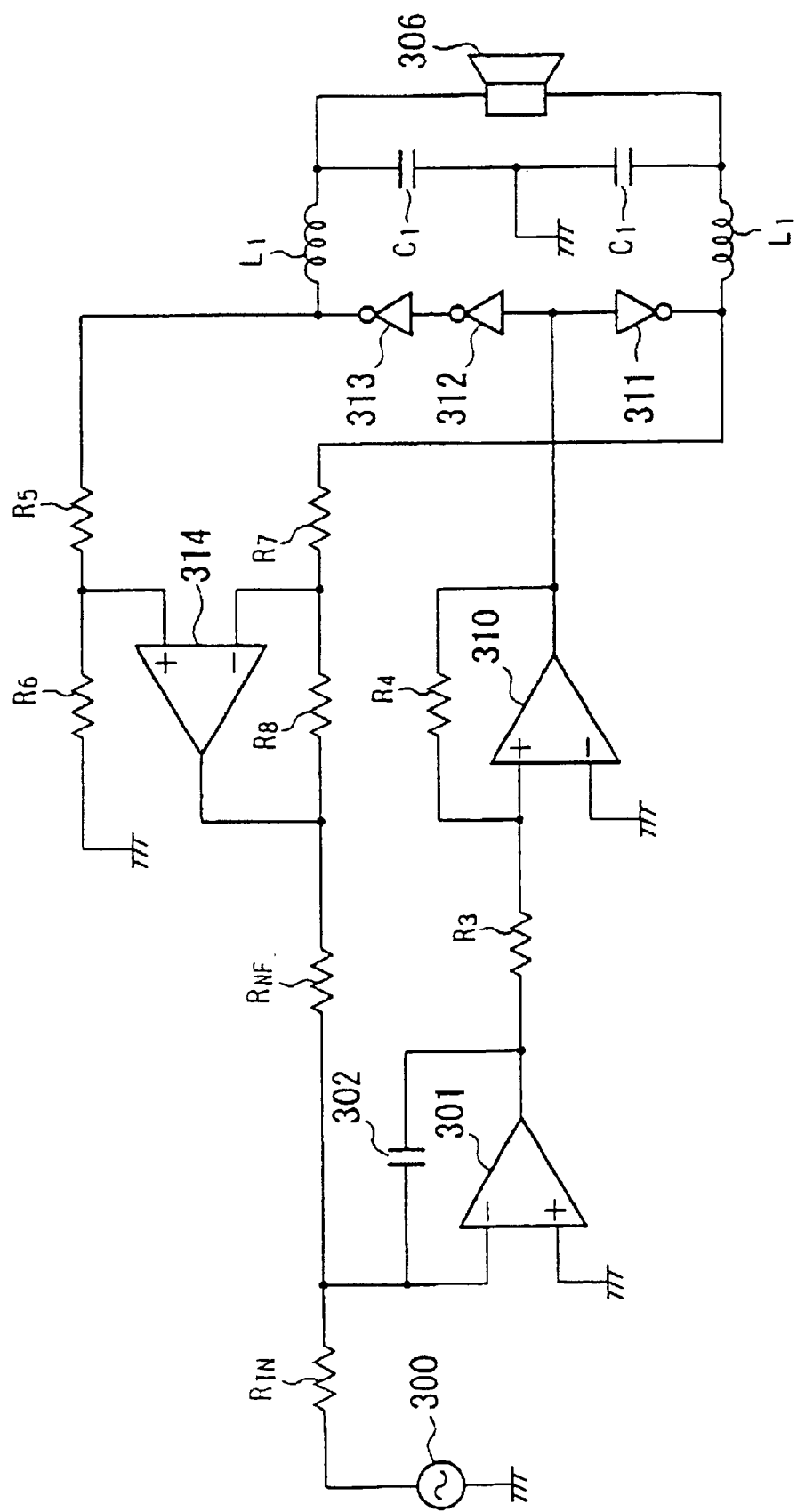
FIG. 14 is a circuit diagram showing an example of an improvement over the conventional self-operating PWM amplifier.

Specifically, In FIG. 14, the self-operating PWM amplifier includes the integrator circuit that is composed of an operational amplifier 301 and a capacitor 302 connected between an inverted input terminal and an output terminal of the operational amplifier 301, a comparator that is composed of resistors R3, R4 and a operational amplifier 310, a signal inverter 312, and CMOS inverters 311, 313 each functioning as a switching circuit. Each of the CMOS inverters 311, 313 is constructed in a similar manner to the CMOS inverter of FIG. 16.

Output terminal of the CMOS inverter 313 is coupled, via a first low-pass filter composed of an inductance L1 and capacitor C1, to one input terminal of a speaker 306 that is a load of the self-operating PWM amplifier. Similarly, an output terminal of the CMOS inverter 311 is coupled, via a second low-pass filter composed of an inductance L1 and capacitor C1, to the other input terminal of the load or speaker 306. The output terminal of the CMOS inverter 311 is also coupled to one input terminal of the differential amplifier section that is composed of resistors R5, R6, R7, R8 and operational amplifier 314, while the output terminal of the CMOS inverter 313 is also coupled to the other input terminal of the differential amplifier section.

Further, an output terminal of the differential amplifier section, i.e. the output terminal of the operational amplifier 314, is coupled via a feedback resistor $R_{NF}$ to an inverted input terminal of the operational amplifier 301 constituting the integrator circuit. The inverted input terminal of the operational amplifier 301 is connected via an input resistor $R_{IN}$ to a signal source 300.

Figure 11:
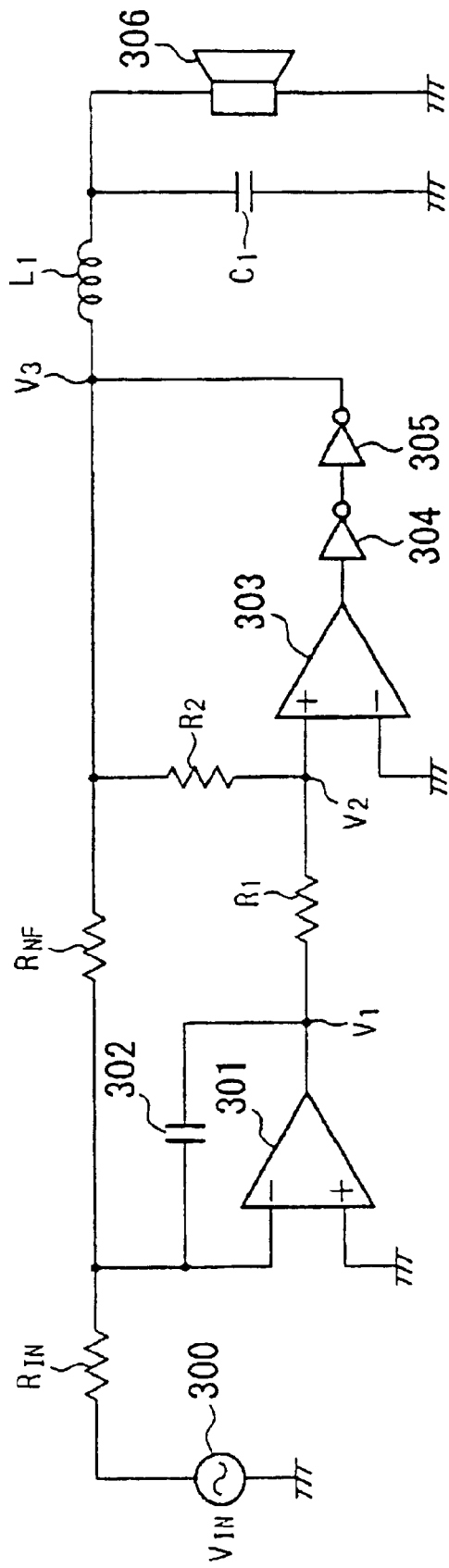
FIG. 11 is a diagram showing a general setup of a conventional self-operating PWM amplifier.
Figure 12:
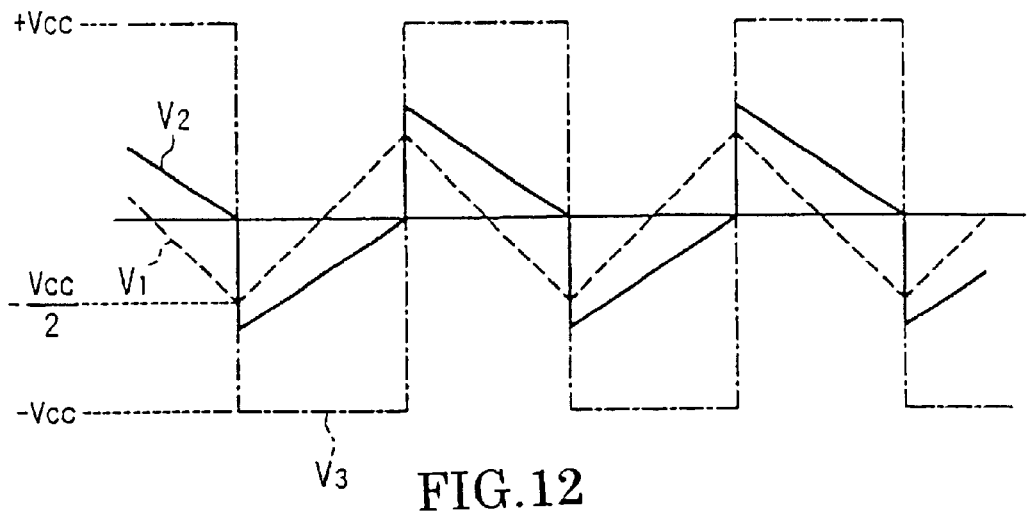
FIG. 12 is a waveform diagram explanatory of operation of various components in the conventional self-operating PWM amplifier of FIG. 11 when no analog signal is input to an integrator circuit of the amplifier.
Figure 13:
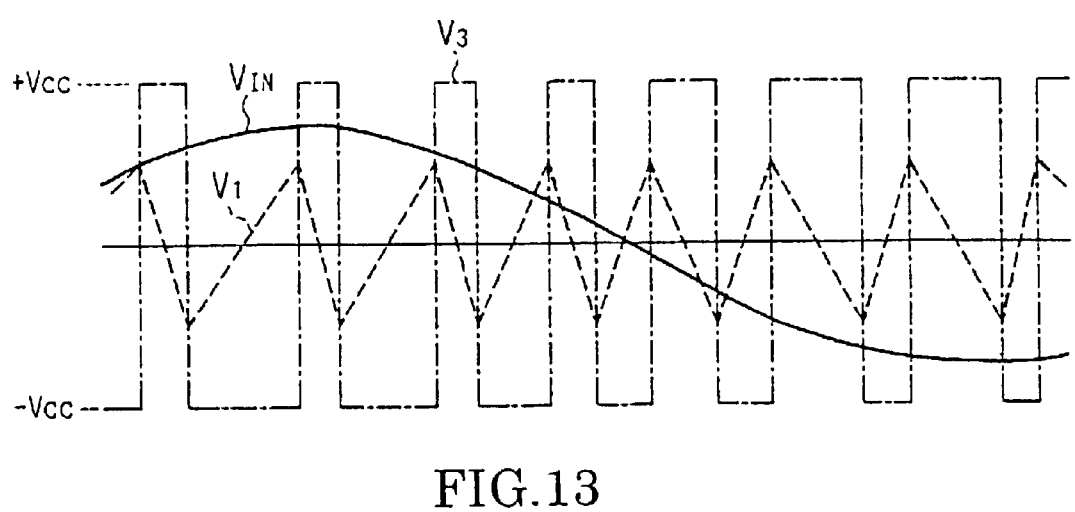
FIG. 13 is a waveform diagram explanatory of operation of the various components in the conventional self-operating PWM amplifier of FIG. 11 when an analog signal,is input to the integrator circuit of the amplifier.

The self-operating PWM amplifier of FIG. 14 arranged in the above-described manner, as a whole, functions as an inverting amplifier having a gain corresponding to a resistance ratio of $R_{NF}/R_{IN}$, similarly to the conventional self-operating PWM amplifier of FIG. 11. However, in the PWM amplifier of FIG. 14, the CMOS inverters 311 and 313, each functioning as a switching circuit to supply electric power to the load or speaker 306, are constructed to produce BTL-type output. The output signal of each of the CMOS inverters 311 and 313, which is driven on the basis of a PWM signal output from the comparator composed of the resistors R3, R4 and operational amplifier 310, is delivered to the corresponding input terminal of the differential amplifier section composed of the resistors R5, R6, R7, R8 and operational amplifier 314. Voltage proportional to a difference between the signals thus delivered to the two input terminals of the differential amplifier section is fed, via the feedback resistor $R_{NF}$, back to the inverted input terminal of the operational amplifier 301, so that the PWM amplifier can operate by itself, i.e. in a self-running fashion.

Further, because the self-operating PWM amplifier of FIG. 14 is arranged in such a manner that the BTL-type output signals (i.e., output signals from the CMOS inverters 311 and 313) are each negatively fed, via the differential amplifier section, back to the input side of the integrator circuit, the PWM amplifier may be more or less effective in eliminating part of external noise. However, the integrator circuit composed of the capacitor 302 and operational amplifier 301 and the comparator composed of the resistors R3, R4 and operational amplifier 310 perform switching operations at a high frequency, which tends to cause noise in these portions that can not be eliminated. Therefore, in a case where such PWM amplifiers of a plurality of channels are mounted together on a single semiconductor chip, even the improvement of FIG. 14 can not provide a solution to the problem of interferences between the PWM amplifiers.

Figure 15:
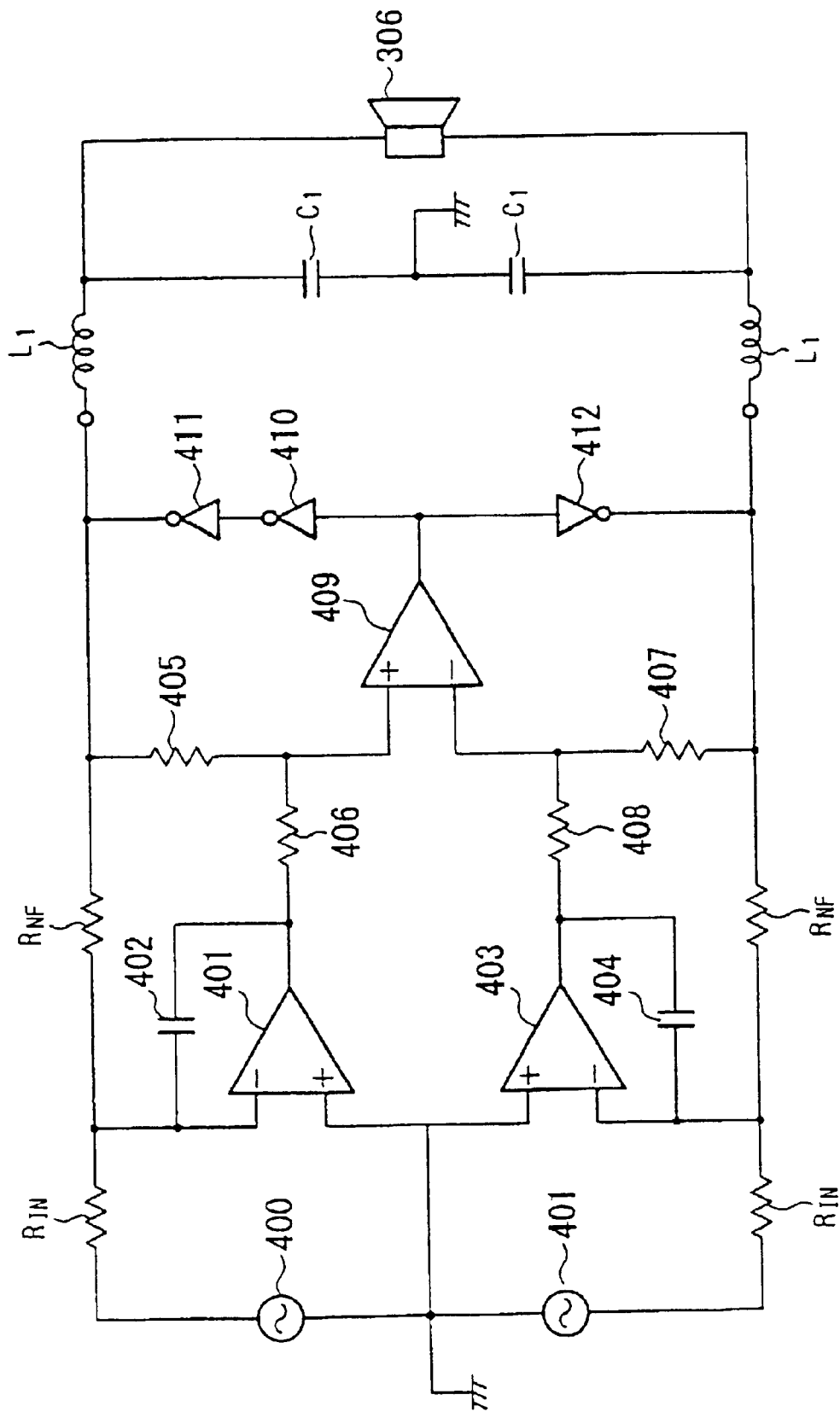
FIG. 15 is a circuit diagram showing another example of construction where all circuits, except for the comparator, of the self-operating PWM amplifier.

FIG. 15 shows another example of an improvement over the conventional self-operating PWM amplifier, which is characterized in that all circuits, except for a comparator, are constructed in a differential manner. Specifically, the improved self-operating PWM amplifier of FIG. 15 includes: a first integrator circuit composed of an operational amplifier 401 and capacitor 402; a second integrator circuit composed of an operational amplifier 403 and capacitor 404; a comparator composed of resistors 405, 406, 407, 408 and operational amplifier 409; an inverter 410; CMOS inverters 411, 412; and a pair of low-pass filters composed of inductances L1 and capacitors C1 connected between corresponding output terminals of the CMOS inverters 411, 412 and corresponding input terminals of a load or speaker 306.

Output terminal of the CMOS inverter 411 is coupled via a feedback resistor $R_{NF}$ to an inverted input terminal of the operational amplifier 401 constituting the first integrator circuit, while an output terminal of the CMOS inverter 412 is coupled via another feedback resistor $R_{NF}$ to an inverted input terminal of the operational amplifier 403 constituting the second integrator circuit. Noninverted input terminals of the operational amplifiers 401 and 403 are interconnected and then grounded. The inverted input terminal of the operational amplifier 401 is connected via an input resistor $R_{IN}$ to a signal source 400, and the inverted input terminal of the operational amplifier 403 is connected via another input resistor $R_{IN}$ to another signal source 401.

The signal source 400 is a source for supplying an analog signal, and the other signal source 401 is a source for supplying an analog signal that has the same amplitude as, but is opposite in phase to, the analog signal supplied from the signal source 400.

The self-operating PWM amplifier of FIG. 15, where the integrator circuits operating at a high frequency are constructed differentially by the two operational amplifiers, can not effectively eliminate external noise, although it may appear to be more or less effective in eliminating external noise. This is because the operational amplifiers employed here are of a conventional type and thus such circuit structure can not appropriately deal with in-phase input signals. Namely, if there is a subtle variation in the positive and negative supply voltages to be applied to the operational amplifiers, or if in-phase input signals are applied to the operational amplifiers, then the output of the operational amplifier 401 constituting the first integrator circuit and the output of the operational amplifier 403 constituting the second integrator circuit both increase in the positive direction with respect to a reference voltage and tend to be fixed to given levels, so that the necessary integration operations are undesirably halted and hence the operational amplifier 409 also can not perform the comparator function any longer.

Namely, merely constructing the circuitry of the self-operating PWM amplifier as balanced circuitry does not allow the PWM amplifier to operate appropriately. The present invention has been made in view of the foregoing, and it will be described in detail hereinbelow.

Figure 1:
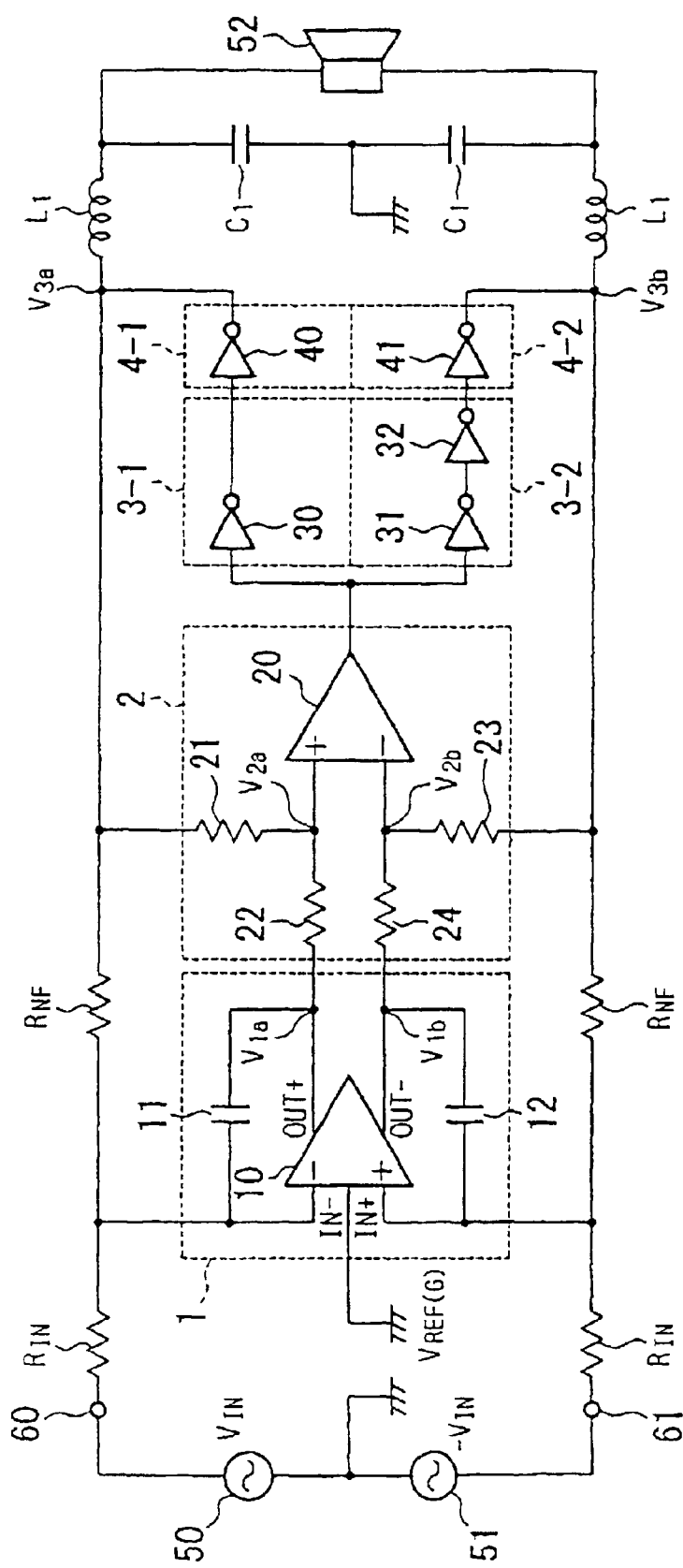
FIG. 1 is a diagram showing a general setup of a self-operating PWM amplifier in accordance with a first embodiment of the present invention.

Now, with reference to FIG. 1, a detailed description will be made about a self-operating PWM amplifier in accordance with a first embodiment of the present invention. In FIG. 1, the self-operating PWM amplifier of the present invention includes a differential integrator circuit 1, a comparator 2, driver circuits 3-1, 3-2, switching circuits 4-1, 4-2, and a pair of low-pass filters, each composed of an inductance L1 and capacitor C1, connected between respective input terminals of a speaker 52, i.e. a load of the amplifier, and the switching circuits 4-1, 4-2.

The differential integrator circuit 1 includes an operational amplifier 10 of an in-phase feedback type. The operational amplifier 10 has a pair of differential input terminals, i.e. inverted input terminal IN− and noninverted input terminal IN+, to which are input analog signals and feedback signals of amplified output of the PWM amplifier, and a pair of differential output terminals, i.e. inverted output terminals OUT− and OUT+. The differential integrator circuit 1 also includes an integrating capacitor 11 connected between the inverted input terminal IN− and inverted input terminal OUT+ of the operational amplifier 10, and another integrating capacitor 12 connected between the noninverted input terminal IN+ and inverted input terminal OUT− of the operational amplifier 10.

Further, in the self-operating PWM amplifier of FIG. 1, the comparator 2 includes resistors 21, 22, 23, 24 and an operational amplifier 20. Noninverted input terminal of the operational amplifier 20 is connected via the resistor 22 to the inverted input terminal OUT+ of the operational amplifier 10 of the differential integrator circuit 1, while an inverted input terminal of the operational amplifier 20 is connected via the resistor 24 to the inverted input terminal OUT− of the operational amplifier 10.

Furthermore, the noninverted input terminal of the operational amplifier 20 is connected via the resistor 21 to an output terminal of the switching circuit 4-1, and the inverted input terminal of the operational amplifier 20 is connected via the resistor 23 to an output terminal of the other switching circuit 4-2. Thus, positive feedback is provided from the output terminals of the switching circuits 4-1 and 4-2 to the differential input terminals of the operational amplifier 20, so as to construct the comparator 2 having hysteresis characteristics.

The driver circuit 3-1 comprises an inverter 30, while the other driver circuit 3-2 comprises inverters 31 and 32 connected in series with each other. Output terminal of the driver circuit 3-1 is coupled to an input terminal of the switching circuit 4-1 comprising a CMOS inverter 40, while an output terminal of the other driver circuit 3-2 is coupled to an input terminal of the switching circuit 4-2 comprising a CMOS inverter 41.

Figure 16:
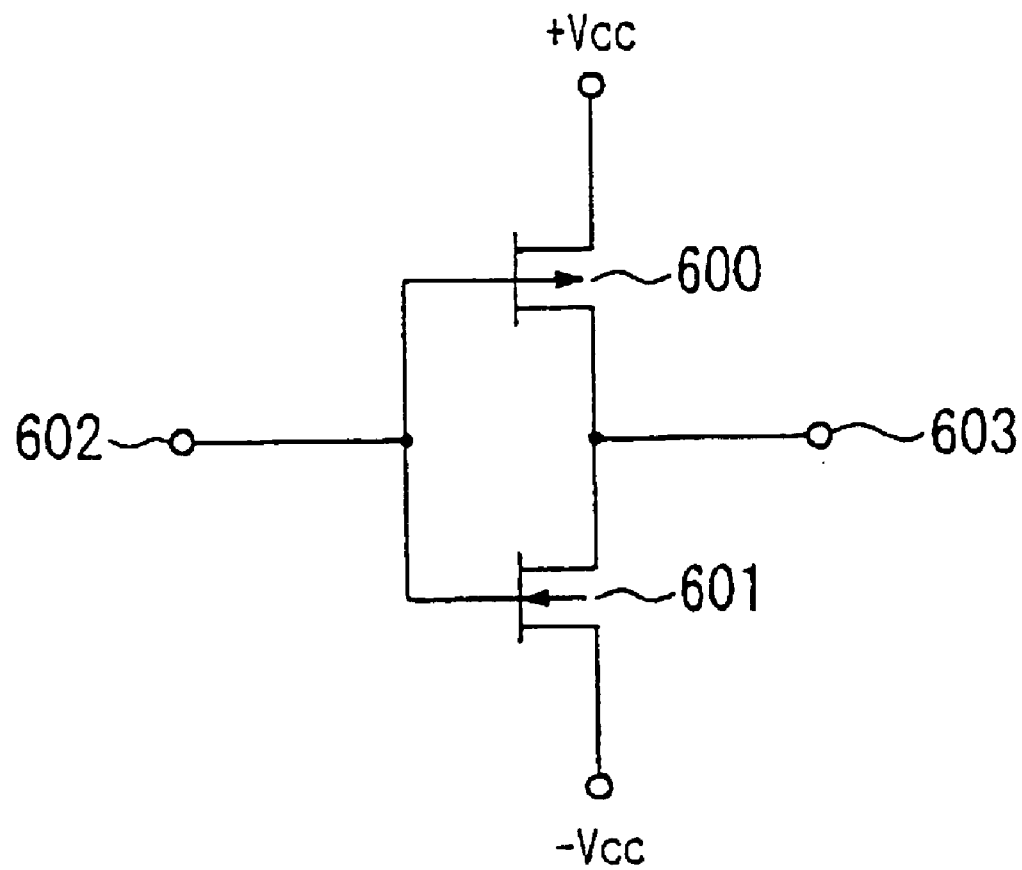
FIG. 16 is a circuit diagram showing connections between components in a CMOS inverter used as a switching circuit in the output stage of the self-operating PWM amplifier.

Each of the CMOS inverters 40 and 41 is similar to the CMOS inverter of FIG. 16, where the source of a PMOS transistor is connected to a positive supply voltage +Vcc and the source of a NMOS transistor is connected to a negative supply voltage −Vcc. Further, the gates of the PMOS transistor and NMOS transistor are interconnected so that the connection point between the sources of these PMOS and NMOS transistors is provided as the input terminal of the CMOS inverter in question, and the drains of the PMOS transistor and NMOS transistor are interconnected so that the connection point between the drains of these PMOS and NMOS transistors is provided as the output terminal of the CMOS inverter in question.

The output terminal of the CMOS inverter 40 is coupled to the inverted input terminal IN− of the operational amplifier 10 of the differential integrator circuit 1 via the feedback resistor $R_{NF}$ functioning as a first feedback circuit, while the output terminal of the CMOS inverter 41 is coupled to the noninverted input terminal IN+ of the operational amplifier 10 via the feedback resistor $R_{NF}$ functioning as a second feedback circuit.

The inverted input terminal IN− of the operational amplifier 10 is connected via an input resistor $R_{IN}$ to one output terminal 60 of a signal source 50, and the noninverted input terminal IN+ of the operational amplifier 10 is connected via another input resistor $R_{IN}$ to one output terminal 61 of another signal source 51. The respective other output terminals of the signal sources 50 and 51 are interconnected to be grounded.

The signal source 51 is a source for supplying an analog signal (audio signal), and the other signal source 51 is a source for supplying an analog signal that has the same amplitude as, but is opposite in phase to, the analog signal supplied from the signal source 50.

Figure 3:
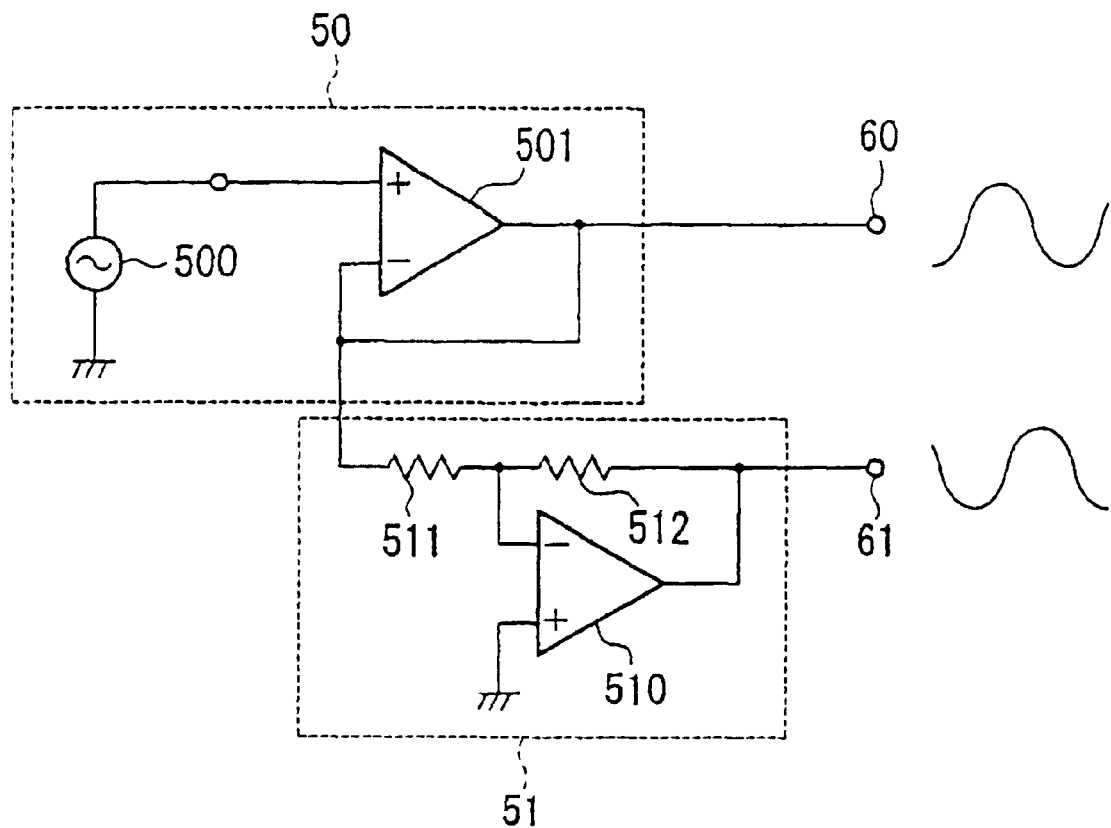
FIG. 3 is a diagram showing detailed construction of signals sources employed in the first embodiment of FIG. 1.

In practice, the signal sources 50 and 51 are constructed in a manner as illustrated in FIG. 3. Namely, the signal source 50 includes an external signal source section 500, and a buffer 501 that buffers an output signal from the signal source section 500 and then outputs the thus buffered signal to the output terminal 60 of the signal source. The other signal source 51 is constructed as an inverting amplifier, which includes resistors 511, 512 and an operational amplifier 510 so that it receives the output signal of the buffer 501 and then outputs an inversion (inverted version) of the received signal to the output terminal 61.

Further, in the self-operating PWM amplifier of FIG. 1, all the components, except for the above-mentioned signal source section 500, the pair of the low-pass filters composed of the inductances L1 and capacitors C1 and the speaker 52, are mounted together on a single semiconductor chip.

Figure 2:
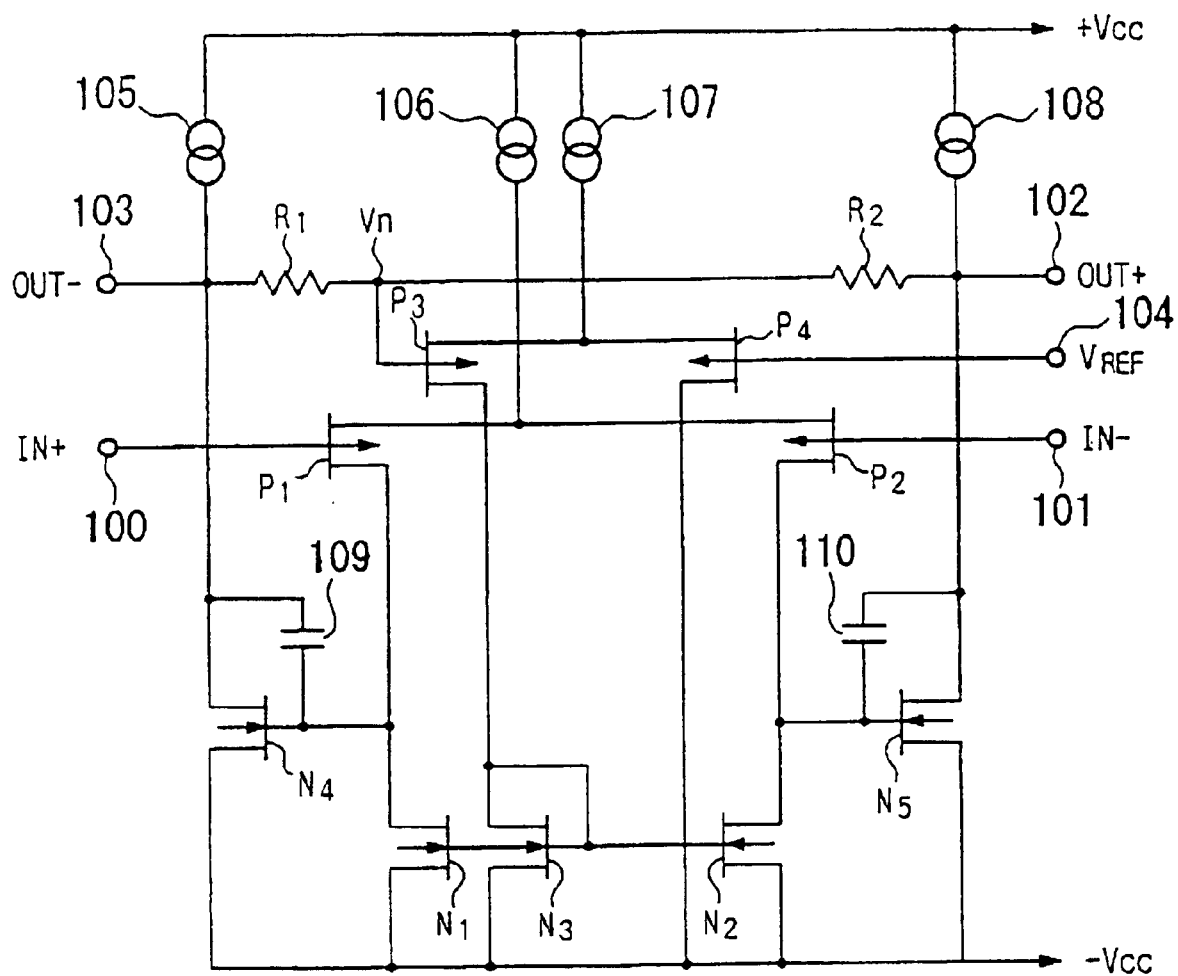
FIG. 2 is a diagram showing detailed construction of an operational amplifier employed in a differential integrator circuit in the first embodiment of FIG. 1.

FIG. 2 shows detailed construction of the operational amplifier 10 of the differential integrator circuit 1. The operational amplifier 10 is constructed as an in-phase feedback type operational amplifier having differential input terminals and differential output terminals. Specifically, the operational amplifier 10 has the noninverted input terminal (IN+) 100, inverted input terminal (IN−) 101, inverted output terminal (OUT+) 102 and inverted output terminal (OUT−) 103, and a reference voltage setting terminal 104.

The gates of PMOS transistors P1 and P2 are connected to the noninverted and inverted input terminals (IN+, IN−) 100 and 101, respectively, the drain of the PMOS transistor P1 is connected to the drain of an NMOS transistor N1, and the drain of the PMOS transistor P2 is connected to the drain of another NMOS transistor N2. Further, the sources of the PMOS transistors P1 and P2 are interconnected to be coupled via a current source 106 to a power supply line over which the supply voltage +Vcc is supplied.

Series circuit of resistors R1 and R2 having a same resistance value is connected between the inverted output terminal 102 and the inverted output terminal 103, and the connection point X between the resistors R1 and R2 is connected to the gate of a PMOS transistor P3; let it be assumed that the connection point X takes on midpoint potential Vn.

Further, the reference voltage setting terminal 104 is connected to the gate of a PMOS transistor P4, and the sources of the PMOS transistors P3 and P4 are interconnected to be coupled via a current source 107 to the power supply line of the supply voltage +Vcc.

The drain of the PMOS transistor P3 is connected with the drain of an NMOS transistor N3, and the drain of the PMOS transistor P4 is coupled to a power supply line over which the supply voltage −Vcc is supplied. Further, the sources of the NMOS transistors N1, N2 and N3 are each coupled to the power supply line of the supply voltage −Vcc, and the gates of these NMOS transistors N1, N2 and N3 are interconnected.

The drain and gate of the NMOS transistor N3 are short-circuited, and the NMOS transistors N1, N2 and N3 constitute a current mirror.

Furthermore, the inverted output terminals 102 and 103 are connected, via current sources 108 and 105, to the power supply line of the supply voltage +Vcc. Also, the inverted output terminals 102 and 103 are connected to the drains of NMOS transistors N5 and N4, respectively. The gates of the NMOS transistors N4 and N5 are connected to the drains of the NMOS transistors N1 and N2, respectively, and the sources of the NMOS transistors N4 and N5 are connected to the power supply line of the supply voltage −Vcc.

Capacitors 109 and 110 are connected between the drains and gates of the NMOS transistors N4 and N5, respectively. For example, the reference voltage setting terminal 104 is set at a reference voltage of 0 V.

This and following paragraphs briefly explain behavior of the operational amplifier 10 constructed in the above-described manner. Let it be assumed that the midpoint potential Vn has dropped during operation of the operational amplifier 10. In this case, the current flowing from the current source 107, via the PMOS transistor P3, to the NMOS transistor N3 increases, in response to which the current flowing to the transistors N1 and N2 constituting the current mirror also increases.

As a consequence, the potential between the gates and sources of the NMOS transistors N4 and N5 drops, so that the NMOS transistors N4 and N5 are turned off and the potential at the inverted output terminals 103 and 102 increases. Consequently, the midpoint potential Vn at the connection point X increases to equal the reference voltage $V_{REF}$ that is potential at the gate of the PMOS transistor P4. Thus, from the inverted output terminals 102 and 103, there can always be output only the midpoint potential Vn, namely, a differential output signal based on the reference voltage $V_{REF}$.

Namely, since in-phase feedback is provided to allow the midpoint potential Vn to equal the reference voltage $V_{REF}$, the operational amplifier 10 always operates in such a manner that only a differential output signal based on the reference voltage $V_{REF}$ is output from the inverted output terminals 102 and 103 even when in-phase input signals are applied to the operational amplifier 10.

Because the operational amplifier 10 thus constructed is employed in the integrator circuit 1, the circuits of the self-operating PWM amplifier of FIG. 1, except for the comparator 2, can operate in a completely balanced manner.

Now, operation of the self-operating PWM amplifier of FIG. 1 will be described below, with reference to FIG. 1 and FIG. 4. Analog signals $V_{IN}$ and $-V_{IN}$ of opposite phases output from the signal sources 50 and 51 are input, via the corresponding input resistors $R_{IN}$, to the inverted input terminal IN− and noninverted input terminal IN+, respectively, of the operational amplifier 10, and portions of output signals from the CMOS inverters 40 and 41, constituting the switching circuits 4-1 and 4-2, are negatively fed, via the corresponding input resistors $R_{NF}$, back to the inverted input terminal IN− and noninverted input terminal IN+, respectively, of the operational amplifier 10.

The differential integrator circuit 1 operates in a completely balanced fashion. Namely, the integrator circuit 1 equivalently integrates a differential between a difference between the analog signal $V_{IN}$ supplied from the signal source 50 and the output signal (switching signal) negatively fed back from the CMOS inverter 40 via the feedback resistor $R_{NF}$ and a difference between the analog signal $-V_{IN}$ supplied from the signal source 51 and the output signal (switching signal) negatively fed back from the CMOS inverter 41 via the input resistor $R_{NF}$, so that it outputs two integrated signals of different polarities to the comparator 2 having hysteresis characteristics.

The comparator 2 compares the two integrated signals input from the integrator circuit 1, to produce a binary PWM signal having a pulse with corresponding to the input signals. This PWM signal is amplified via the driver circuits 3-1 and 3-2, and these driver circuits 3-1 and 3-2, on the basis of the PWM signal, drives the CMOS inverters 40 and 41 (switching circuits 4-1 and 4-2) for switching operations.

The output signal from the CMOS inverter 40 is output to the one input terminal of the speaker 52 via the low-pass filter composed of the inductance L1 and capacitor C1, while the output signal from the CMOS inverter 41 is output to the other input terminal of the speaker 52 via the other low-pass filter composed of the inductance L1 and capacitor C1. At the same time, the output signals from the CMOS inverters 40 and 41 are negatively fed, via the corresponding feedback resistors $R_{NF}$, back to the inverted input terminal IN− and noninverted input terminal IN+, respectively, of the operational amplifier 10, so that the PWM amplifier of FIG. 1 can operate by itself.

When the output of the CMOS inverter 40 is at the level of the positive supply voltage +Vcc, the output voltage $V_{1a}$ at the inverted output terminal OUT+ of the integrator circuit 1 increases in the negative direction with the passage of time, in response to which the input voltage $V_{2a}$ to the operational amplifier 20 of the comparator 2 also increases in the negative direction. Then, once the input voltage $V_{2a}$ has dropped to 0 V, the output of the operational amplifier 20, i.e. the PWM signal, is inverted, so that the output of the CMOS inverter 40 is also inverted.

Because, at this time, the inverted output of the CMOS inverter 40 is positively fed back to the input side of the operational amplifier 20, the input voltage $V_{2a}$ to the operational amplifier 20 drops rapidly from 0 V to a level determined by the current output voltage $V_{1a}$ from the differential integrator circuit 1, current output voltage $V_{3a}$ from the CMOS inverter 40 and resistance ratio between the resistances 21 and 22.

When the output voltage $V_{3a}$ of the CMOS inverter 40 has shifted from the level of the positive supply voltage +Vcc to the level of the negative supply voltage −Vcc, the output voltage $V_{1a}$ from the differential integrator circuit 1 increases in the positive direction, in response to which the input voltage $V_{2a}$ to the operational amplifier 20 of the comparator 2 also increases in the positive direction. Then, once the input voltage $V_{2a}$ has risen to 0 V, the output of the operational amplifier 20, i.e. the PWM signal, is inverted, so that the output from the CMOS inverter 40 shifts from the level of the negative supply voltage −Vcc to the level of the positive supply voltage +Vcc.

Because, at this time, the inverted output of the CMOS inverter 40 is positively fed back to the input side of the operational amplifier 20, the input voltage $V_{2a}$ to the operational amplifier 20 rises rapidly from 0 V to a level determined by the current output voltage $V_{1a}$ from the differential integrator circuit 1, current output voltage $V_{3a}$ from the CMOS inverter 40 and resistance ratio between the resistances 21 and 22.

Figure 4A:
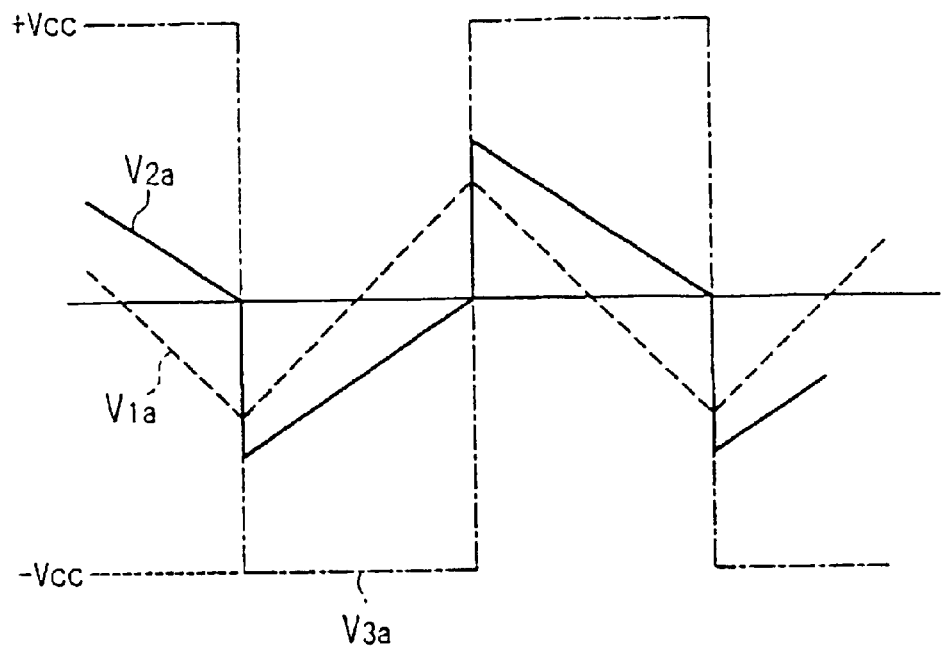
FIGS. 4A and 4B are waveform diagrams explanatory of operation of various components in the first embodiment of FIG. 1.

In this manner, the output voltage $V_{1a}$ from the differential integrator circuit 1, input voltage $V_{2a}$ to the operational amplifier 20 and output voltage $V_{3a}$ from the CMOS inverter 40 vary as illustrated in FIG. 4A.

Figure 4B:
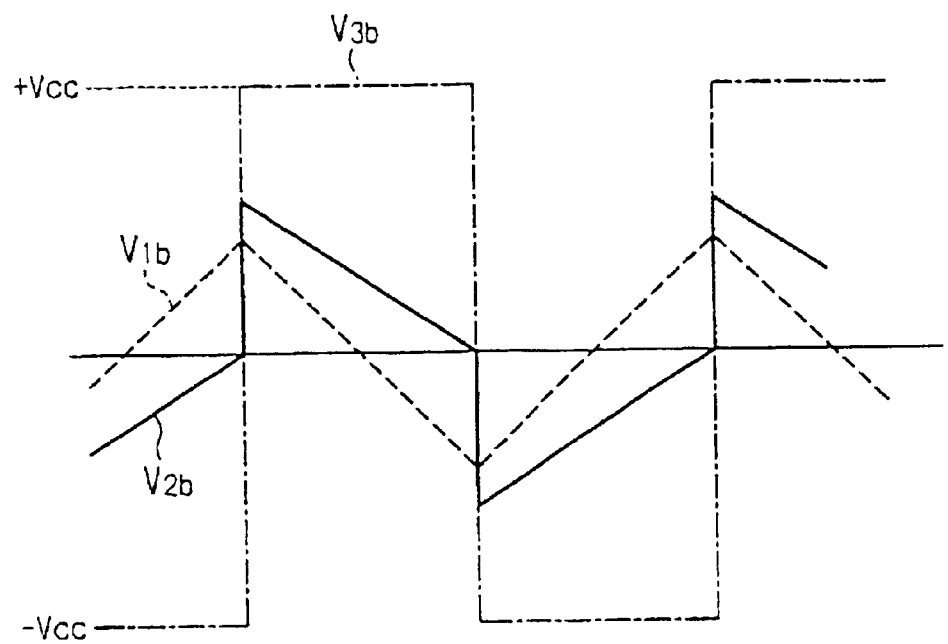

Further, because the output voltage $V_{3b}$ from the other CMOS inverter 41 presents a waveform that is the inverse or opposite of the waveform of the output voltage $V_{3a}$ from the CMOS inverter 40, the output voltage $V_{1b}$ at the inverted output terminal OUT− of the differential integrator circuit 1 and input voltage $V_{2b}$ to the operational amplifier 20 also present waveforms that are the inverses of the waveforms of the output voltage $V_{1a}$ from the differential integrator circuit 1 and input voltage $V_{2a}$ to the operational amplifier 20, as shown in FIG. 4B. However, assume here that the resistors 22 and 24 are equal in resistance value, and so are the resistors 21 and 23.

In the first embodiment of the self-operating PWM amplifier, the entire circuitry is constructed as balanced circuitry to receive balanced input signals and produce balanced output signals, as having been described above. This balanced circuit arrangement of the embodiment can reduce influences of external noise and thus can minimize mutual interferences. Further, the balanced operations of the self-operating PWM amplifier can cancel out distortion of even-number order harmonics, and thus the embodiment achieves an improved distortion factor characteristic.

Furthermore, with the arrangement that positive feedback is provided to the two differential input terminals of the comparator, the input voltage to the comparator at predetermined comparison timing can be 0 V so that the comparator can operate at low voltage.

Moreover, because the operational amplifier constituting the integrator circuit comprises an in-phase feedback type operational amplifier having differential input terminals and differential output terminals, the integrator circuit in the embodiment of the present invention can operate in a completely balanced manner, which can even further reduce the influences of external noise. Namely, if constructed otherwise, the integrator circuit would be very susceptible to the influences of external noise, due to the facts that the integrating capacitor has high impedance, the integrator circuit is a beginning-stage circuit of the self-operating PWM amplifier and the integrating capacitor repeats recharging/discharging operations at a high frequency. However, because, as described above, the integrator circuit is implemented by the in-phase feedback type operational amplifier having differential input terminals and differential output terminals and it operates in a completely balanced manner, the embodiment can effectively reduce the influences of external noise and operate at low voltage.

Figure 5:
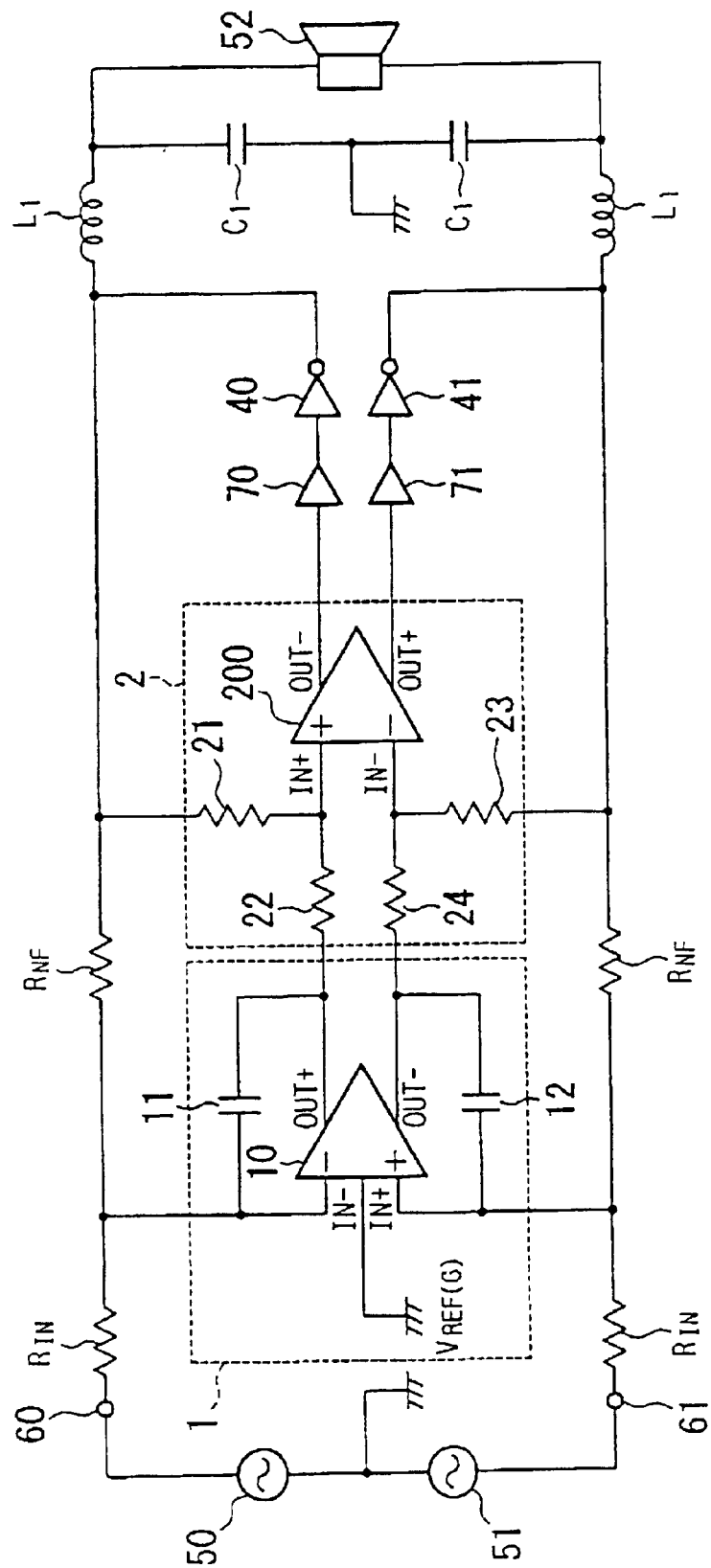
FIG. 5 is a diagram showing a general setup of a self-operating PWM amplifier in accordance with a second embodiment of the present invention.

FIG. 5 shows a general setup of a self-operating PWM amplifier in accordance with a second embodiment of the present invention. The second embodiment is generally similar to the first embodiment but different therefrom in that the comparator 2 is implemented by an in-phase feedback type operational amplifier 200 having differential input terminals and differential output terminals. In FIG. 5, the same elements as in the first embodiment are represented by same reference characters as used for the first embodiment and will not be described in detail to avoid unnecessary duplication. In this figure, reference numerals 70 and 71 represent driver circuits for amplifying PWM signals output from respective inverted output terminals OUT− and OUT+, and 40 and 41 represent CMOS inverters.

Figure 6:
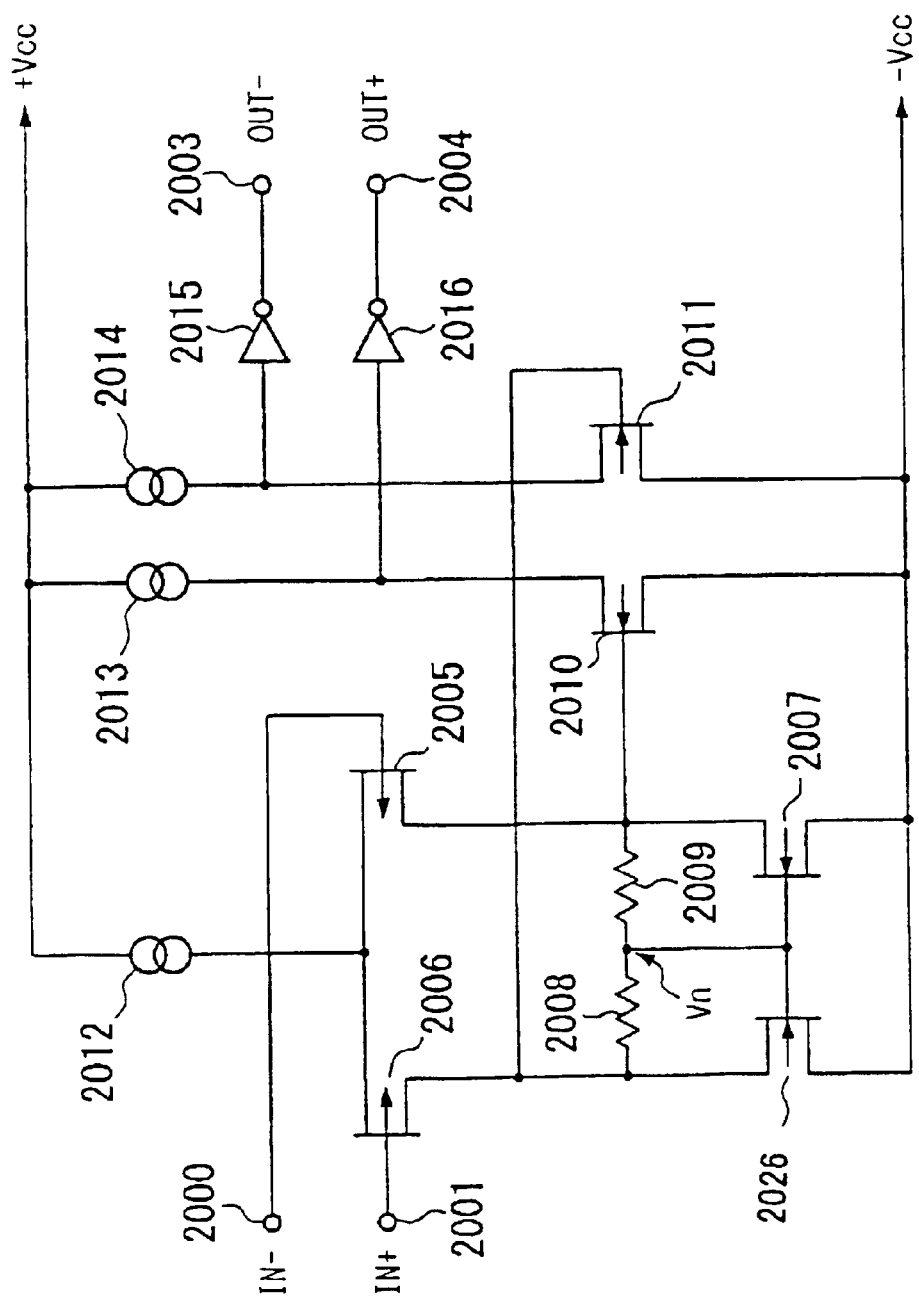
FIG. 6 is a diagram showing detailed construction of a comparator employed in the second embodiment of FIG. 5.

FIG. 6 shows detailed construction of the operational amplifier 200 of the comparator 2. In the figure, the operational amplifier 200 has a pair of inverted input terminal (IN−) 2000 and noninverted input terminal (IN+) 2001, and a pair of inverted output terminals (OUT−) 2003 and inverted output terminal (OUT+) 2004.

The inverted input terminal (IN−) 2000 and noninverted input terminal (IN+) 2001 are connected to the gates of PMOS transistors 2005 and 2006, respectively, which constitute a differential input stage. The sources of the PMOS transistors 2005 and 2006 are interconnected to be coupled via a current source 2012 to a power supply line over which a supply voltage +Vcc is supplied. The drains of the PMOS transistors 2005 and 2006 are connected to the drains of NMOS transistors 2007 and 2026, respectively, and the sources of the NMOS transistors 2007 and 2026 are interconnected to be coupled to a power supply line over which a supply voltage −Vcc is supplied.

Further, the drain of the NMOS transistor 2026 is connected to the drain of the NMOS transistor 2007 via a series circuit of resistors 2008 and 2009, and the gates of the NMOS transistors 2026 and 2007 are interconnected directly. Connection point between the resistors 2008 and 2009 are connected to the respective gates of the NMOS transistors 2026 and 2007.

Further, the gates of NMOS transistors 2010 and 2011, constituting an output stage of the operational amplifier 200, are connected to the drains of the NMOS transistors 2007 and 2026, respectively. The drains of the NMOS transistors 2010 and 2011 are connected, via corresponding current sources 2013 and 2014, to the power supply line of the supply voltage +Vcc.

Furthermore, the sources of the NMOS transistors 2010 and 2011 are interconnected to be coupled to the power supply line of the supply voltage −Vcc. The drain of the NMOS transistor 2011 is connected via an inverter 2015 to the inverted output terminal (OUT−) 2003, while the drain of the NMOS transistor 2010 is connected via an inverter 2016 to the inverted output terminal (OUT+) 2004.

The use of the operational amplifier 200 can provide the differential-input/differential-output type comparator 2 which operates to eliminate in-phase components.

Because the comparator 2 having hysteresis characteristics is implemented by the differential-input/differential-output and in-phase feedback type operational amplifier, the comparator 2 in can operate in a completely balanced manner as set forth above, the second embodiment of the self-operating PWM amplifier can even further reduce the influences of external noise.

Next, with reference to FIGS. 7 to 9, a description will be made about a self-operating PWM amplifier in accordance with a third embodiment of the present invention. This third embodiment is characterized in that the feedback circuitry for negatively feeding amplified output back to the initial-stage differential integrator circuit is constructed as multiple feedback circuitry composed of a first feedback loop for passing a high-frequency component of the amplified output and a second feedback loop for a passing low-frequency component of the amplified output.

Figure 7:
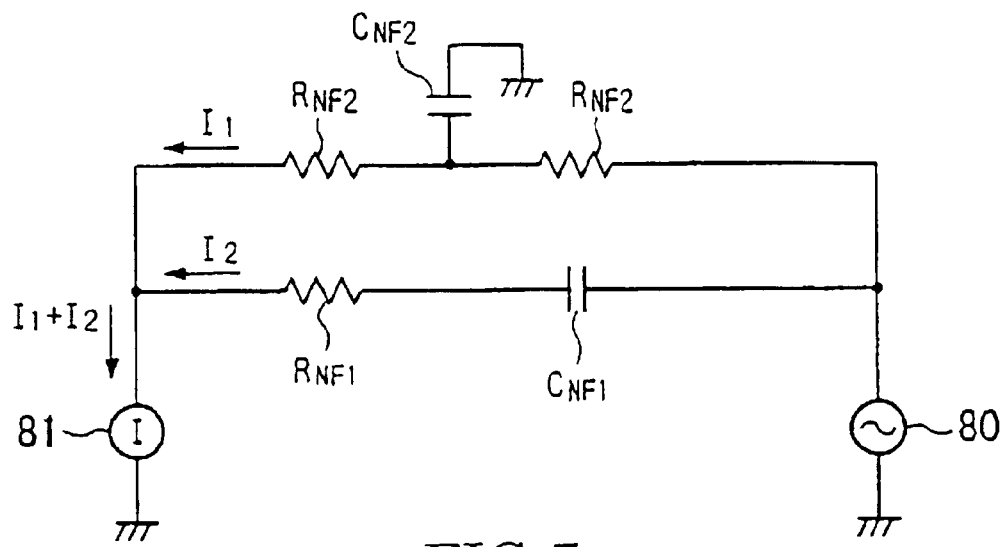
FIG. 7 is a diagram showing detailed construction of feedback circuitry employed in the third embodiment.

FIG. 7 shows detailed construction of the feedback circuitry employed in the third embodiment of the self-operating PWM amplifier. As shown, this feedback circuitry comprises the first feedback loop that is connected between the output side of the PWM amplifier and the input side of the differential integrator circuit and includes a series circuit of a feedback resistor $R_{NF1}$ and feedback capacitor $C_{NF1}$ for passing the high-frequency component of the amplified output, and the second feedback loop constructed as a T-shaped circuit composed of a feedback resistor $R_{NF2}$ and feedback capacitor $C_{NF2}$ for passing the low-frequency component of the amplified output.

In FIG. 7, reference numeral 80 represents a voltage source provided in the output stage of the self-operating PWM amplifier, and 81 represents a current source provided at the input side of the differential integrator circuit of the PWM amplifier. If the resistance value of the feedback resistor $R_{NF1}$ is represented as "R" and the capacity value of the feedback capacitor $C_{NF1}$ is represented as "C", then the resistance value of the feedback resistor $R_{NF2}$ can be given as "R/2" and the capacity value of the feedback capacitor $C_{NF2}$ can be given as "4C".

Figure 9:
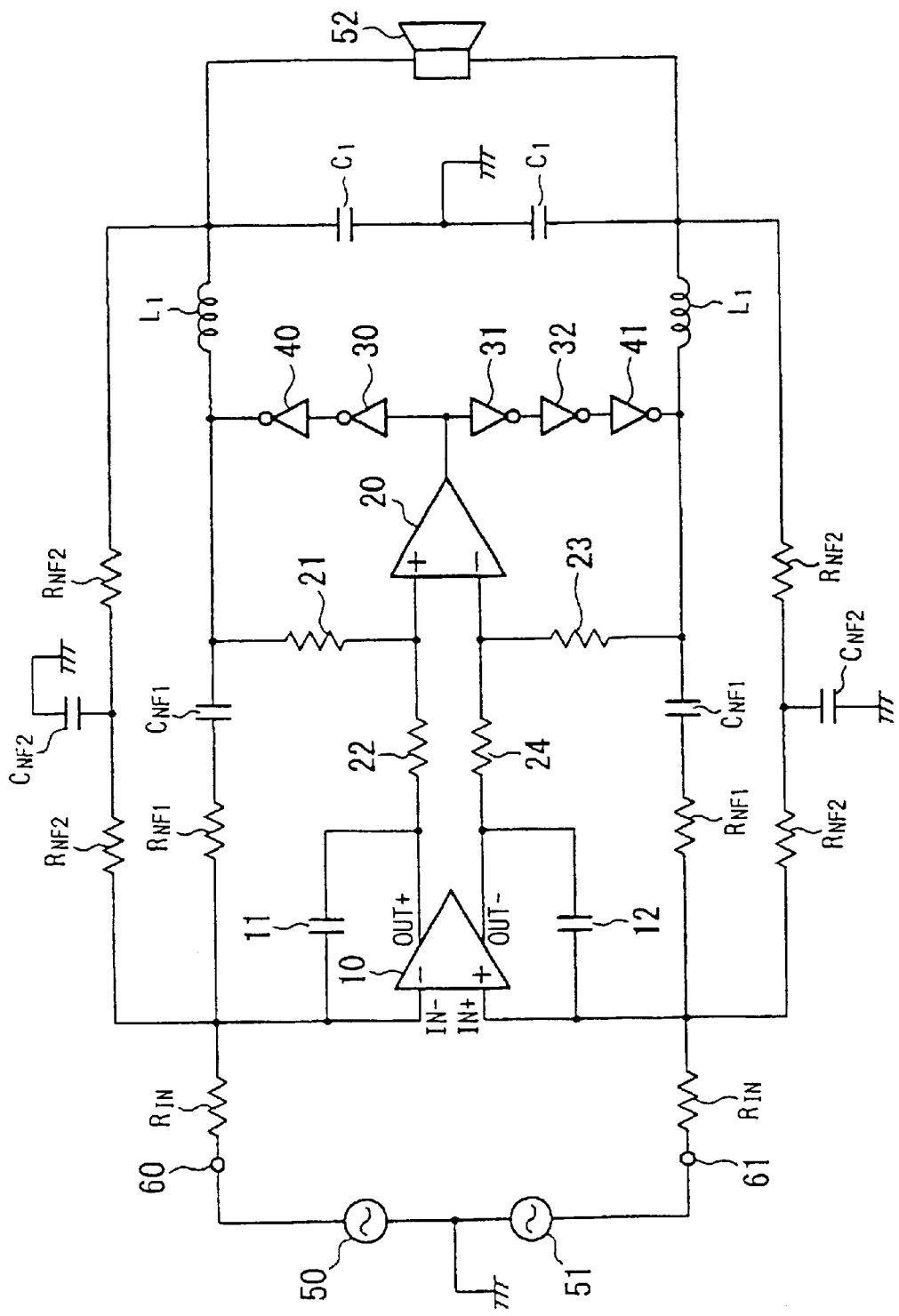
FIG. 9 is a diagram showing a general setup of a self-operating PWM amplifier in accordance with a third embodiment of the present invention.

As shown in FIG. 9 the third embodiment is generally similar to the first embodiment of FIG. 1 but different therefrom only in that it replaces the feedback circuit in the first embodiment of FIG. 1 with the multiple feedback circuitry of FIG. 7. Because the third embodiment of the self-operating PWM amplifier is wholly constructed as balanced circuitry, its feedback circuitry also includes a first feedback circuit connected between the output side of the amplifier and the inverted input side of the differential integrator circuit and a second feedback circuit connected between the output side of the amplifier and the noninverted input side of the differential integrator circuit.

In FIG. 9, the first feedback circuit includes the first feedback loop that is provided by connecting the series circuit of the feedback resistor $R_{NF1}$ and feedback capacitor $C_{NF1}$ between the output terminal of the CMOS inverter 40 and the inverted input terminal of the operational amplifier 10 of the differential integrator circuit, and the second feedback loop that is constructed as the T-shaped circuit composed of the feedback resistor $R_{NF2}$ and feedback capacitor $C_{NF2}$ connected between the output terminal of the low-pass filter, composed of the inductance L1 and capacitor C1, and the inverted input terminal of the operational amplifier 10. The second feedback circuit is generally similar in construction to the first feedback circuitry and hence will be not described here.

Figure 8:
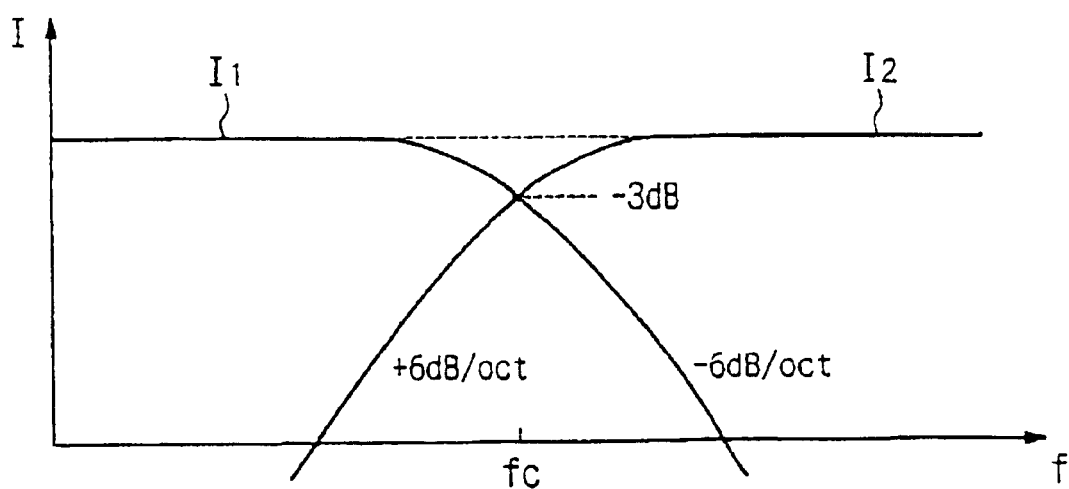
FIG. 8 is a diagram showing frequency characteristics of amplified output from embodiments of the invention to which the feedback circuitry is applied.

In each of the first and second feedback circuits, as shown in FIG. 8, the first feedback loop can obtain a frequency characteristic $I_2$ for passing the high-frequency component of the output signal to be supplied to the load or speaker 52, while the second feedback loop can obtain a frequency characteristic $I_1$ for passing the high-frequency component of the output signal to be supplied to the load or speaker 52. As a result, there can be provided, from synthesis between the frequency characteristics I1 and I2, flat frequency characteristics over wide (from low to high) frequency bands.

Here, for each of frequency characteristic I1 and I2, a cutoff frequency fc for achieving an amplified output signal of −3 dB is given as "½πCR", and, for example, 10 kH is chosen as the cutoff frequency fc.

With the arrangement that each of the first and second feedback circuits includes the first feedback loop for passing the high-frequency component of the amplified output to be supplied to the load and the second feedback loop for passing the low-frequency component of the amplified output, the third embodiment achieves an improved S/N ratio and distortion factor characteristic over wide frequency bands of input signals.

Figure 10:
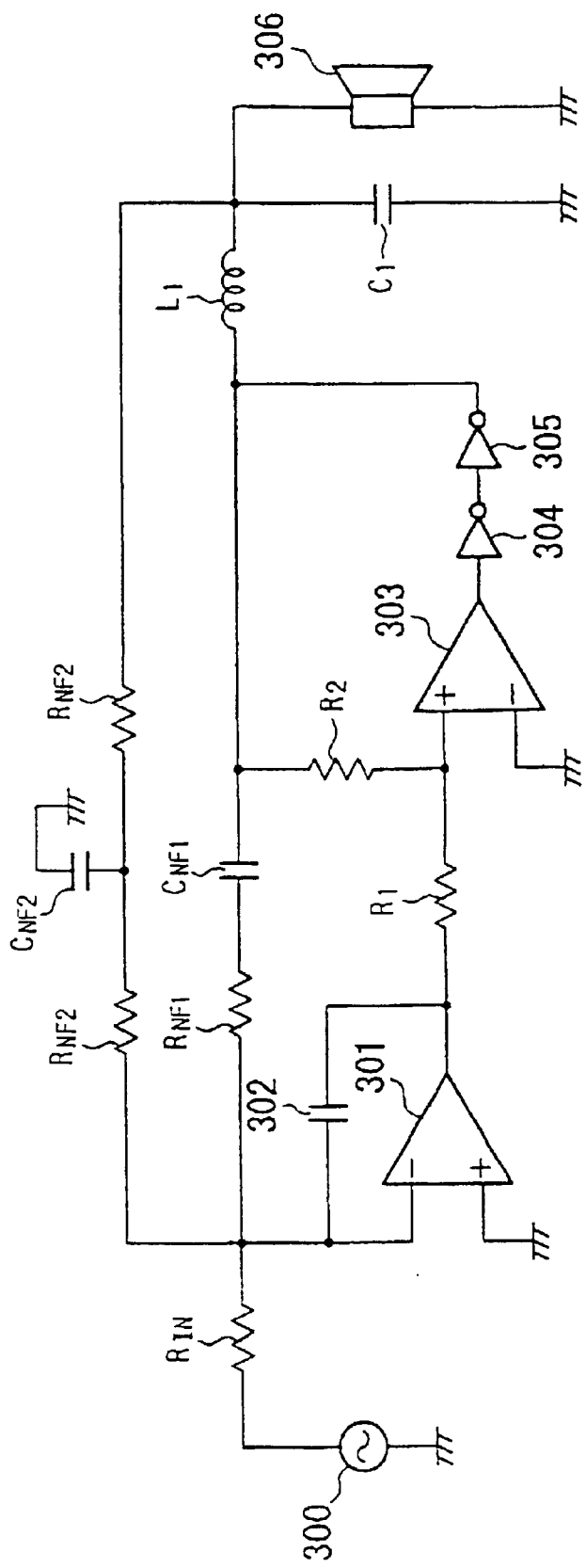
FIG. 10 is a diagram showing another embodiment of the present invention which is constructed by applying the feedback circuitry of FIG. 7 to a conventional self-operating PWM amplifier.

FIG. 10 shows another embodiment of the present invention which is constructed by employing the feedback circuitry of FIG. 7 in place of the feedback resistance RNF that is connected between the amplifier output side and the input side of the integrator circuit in the conventional self-operating PWM amplifier of FIG. 11. This arrangement achieves an highly improved S/N ratio and distortion factor characteristic over wide frequency bands, as compared to the conventional self-operating PWM amplifier.

In summary, because the self-operating PWM amplifier of the invention is characterized in that its entire circuitry is constructed as balanced circuitry to receive balanced input signals and produce balanced output signals, it can reduce influences of external noise and can minimize unwanted interferences in a case where a plurality of such amplifiers are mounted together Further, the balanced operations of the self-operating PWM amplifier, permitted by the balanced circuitry, can effectively cancel out distortion of even-number order harmonics, and thus achieves an improved distortion factor characteristic.

The present invention relates to the subject matter of Japanese Patent Application No. 2001-298268 filed Sep. 27, 2001, the disclosure of which is expressly incorporated herein by reference in its entirety.

What is claimed is:

1. A self-operating PWM amplifier comprising:
   a differential integrator circuit having a first input terminal to which are inputted a first analog signal supplied from a first signal source and a negative feedback signal of amplified output of said PWM amplifier, and a second input terminal to which are inputted a second analog signal supplied from a second signal source and a negative feedback signal of the amplified output of said PWM amplifier, said second analog signal having a same amplitude as, but being opposite in phase from, said first analog signal, said differential integrator circuit outputting two integrated signals of different polarities by integrating a difference between said first analog signal and the negative feedback signal inputted to said first input terminal and a difference between said second analog signal and the negative feedback signal inputted to said second input terminal;
   a comparator having two differential input terminals to which positive feedback is provided to present hysteresis characteristics, said comparator comparing the two integrated signals outputted by said differential integrator circuit and thereby outputting a PWM signal;
   a first switching circuit including a pair of switching elements connected between first and second power supplies, a connection point between said switching elements being connected to one input terminal of a load;
   a second switching circuit including a pair of switching elements connected between said first and second power supplies, a connection point between said switching elements being connected to another input terminal of the load;
   a first driver circuit that delivers the PWM signal from said comparator to said first switching circuit; and
   a second driver circuit that delivers the PWM signal from said comparator to said second switching circuit.

2. A self-operating PWM amplifier as claimed in claim 1 which further comprises:
   a first feedback circuit connected between said first input terminal of said differential integrator circuit and an output terminal of said first switching circuit; and
   a second feedback circuit connected between said second input terminal of said differential integrator circuit and an output terminal of said second switching circuit, and
   wherein the negative feedback signal of the amplified output is delivered via said first feedback circuit to said first input terminal of said differential integrator circuit, and the negative feedback signal of the amplified output is delivered via said second feedback circuit to said second input terminal of said differential integrator circuit.

3. A self-operating PWM amplifier as claimed in claim 1 wherein the output terminal of said first switching circuit is connected to the one input terminal of the load via a first low-pass filter for eliminating a carrier-frequency component, and the output terminal of said second switching circuit is connected to the other input terminal of the load via a second low-pass filter for eliminating a carrier frequency component.

4. A self-operating PWM amplifier as claimed in claim 1 wherein said differential integrator circuit includes:
   an in-phase feedback type operational amplifier having a pair of differential input terminals, consisting of inverted and noninverted input terminals, to which are inputted said first analog signal and feedback signal and said second analog signal and feedback signal, respectively, and a pair of differential output terminals, consisting of two inverted output terminals, which output two integrated signals of different polarities; and
   integrating capacitors connected between the inverted input terminal and one of the inverted output terminals of said operational amplifier and between the noninverted input terminal and the other of the inverted output terminals of said operational amplifier, respectively.

5. A self-operating PWM amplifier as claimed in claim 1 wherein said comparator comprises an in-phase feedback type operational amplifier having a pair of differential input terminals to which are inputted the two integrated signals of different polarities outputted by said differential integrator circuit and a pair of differential output terminals for outputting PWM signals of positive and negative phases by comparing the two integrated signals.

6. A self-operating PWM amplifier as claimed in claim 2 wherein each of said first and second feedback circuits includes a first feedback loop for passing a high-frequency component of an amplified output signal to be supplied to the load, and a second feedback loop for passing a low-frequency component of the amplified output signal to be supplied to the load.

* * * * *